US006250538B1

United States Patent
Grasmueller et al.

(10) Patent No.: US 6,250,538 B1
(45) Date of Patent: Jun. 26, 2001

(54) METHOD AND APPARATUS FOR MOUNTING ELECTRICAL COMPONENTS THAT EMPLOYS A COMPENSATION ELEMENT

(75) Inventors: Hans-Horst Grasmueller, Mammendorf; Thomas Bachthaler, Stockdorf; Richard Numberger, Finsing; Frank Barnowski, Munich, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/558,092

(22) Filed: Apr. 26, 2000

(30) Foreign Application Priority Data

Apr. 30, 1999 (DE) ................................ 199 19 917

(51) Int. Cl.[7] ............................ B23K 1/00; B23K 31/02; B23K 37/04
(52) U.S. Cl. ................ 228/179.1; 228/212; 228/6.2; 228/49.1; 228/49.5
(58) Field of Search ............................. 228/179.1, 178, 228/119, 212, 6.2, 2.64, 49.1, 47.1, 49.5; 156/349, 379.2, 538–578

(56) References Cited

U.S. PATENT DOCUMENTS

| 4,019,668 | * | 4/1977 | Diepeveen | 228/3.1 |
|---|---|---|---|---|
| 4,066,200 | * | 1/1978 | Diepeveen | 228/3.1 |
| 4,140,263 | * | 2/1979 | Diepeveen | 228/110 |
| 5,285,946 | | 2/1994 | Tomigashi et al. | |
| 5,351,872 | * | 10/1994 | Kobayashi | 228/6.2 |
| 5,368,217 | * | 11/1994 | Simmons et al. | 228/6.2 |
| 5,422,554 | | 6/1995 | Rohde | |
| 5,447,266 | * | 9/1995 | Misono | 228/102 |
| 5,535,873 | | 7/1996 | Sakamoto et al. | |
| 5,537,204 | | 7/1996 | Woodhouse | |
| 5,661,239 | * | 8/1997 | Takeuchi | 73/432.1 |
| 5,667,129 | * | 9/1997 | Morita et al. | 228/102 |

FOREIGN PATENT DOCUMENTS

| WO 92/22827 | 12/1992 | (WO) |
| WO 97/37522 | 10/1997 | (WO) |
| WO 98/37744 | 8/1998 | (WO) |

* cited by examiner

Primary Examiner—Tom Dunn
Assistant Examiner—Colleen Cooke
(74) Attorney, Agent, or Firm—Schiff Hardin & Waite

(57) ABSTRACT

An mounting apparatus for mounting an electrical component onto a substrate of an electrical assembly. The mounting apparatus employs a compensating element to facilitate the component mounting operation. The compensating element includes a spring member and a damping member. The spring member applies an optimal contact pressure for securely mounting said component without damaging the component. The damping element acts to damp the spring member during so as to effectively reduce a spring force that acts on the mounting apparatus during the component delivery stage.

13 Claims, 2 Drawing Sheets

METHOD AND APPARATUS FOR MOUNTING ELECTRICAL COMPONENTS THAT EMPLOYS A COMPENSATION ELEMENT

BACKGROUND OF THE INVENTION

1. Field of the Invention

This invention relates to a method and apparatus for mounting components onto substrates of an electrical assembly. In particular, the present invention relates to the mounting of electrical components onto printed circuit boards wherein the method and apparatus for mounting such components includes a compensating element that facilitates an optimal component mounting operation.

2. Description of the Prior Art

U.S. Pat. No. 5,285,946 discloses an apparatus for placing electrical components onto the surface of printed circuit boards. The apparatus includes a suction pipette tip that is spring mounted onto a retaining device. This spring-mounted feature results in a cushioning effect that provides the required contact pressure which is necessary for placing the components onto the substrate, while not damaging the electrical component.

However, the spring-mounted feature may not work as effectively when the electrical component is supplied or delivered to the mounting apparatus by a known component delivery or supply mechanism. During the delivery or supply of the components to the mounting apparatus, a substantial amount of force may be exerted onto the electrical component due to the spring-mounted feature of the retaining device which operates to retrieve the component from the delivery mechanism. This force may be so great that the electrical component is dropped from the retaining device, such as, a suction pipette. If an electrical component is dropped during the delivery of the electrical component to the mounting apparatus, the mounting operation of this specific electrical component must be repeated. In addition, the dropped electrical component would necessarily remain in the mounting apparatus and thus may fatally effect the operation of the mounting apparatus due to errors that may result in the movement of the mounting heads or substrates.

SUMMARY OF THE INVENTION

An objective of the present invention is to provide a method and apparatus for mounting electrical components onto substrates of electrical assemblies that provides an effective and optimal delivery of the electrical components from a delivery mechanism. In addition, the present invention supplies an effective and optimal contact pressure that is exerted onto the electrical components as it is delivered from the delivery mechanism or mounted onto the substrate during the component mounting operation.

The present invention includes a retaining device that employs a compensating element to meet these objectives. The compensating element essentially has two members—a spring-type member and a damping member. The spring-type member compensates for the thicknesses of a variety of different substrates and components by generating a contact pressure that is effectively applied during the component mounting operation without resulting in damage to the substrate or component. In addition, the damping member acts to effectively damp or compensate for the force that is exerted by the spring-type member during the component delivery stage. In this way, the retaining device is less likely to drop the component during the delivery stage because the this force is effectively reduced to an amount of force that is less than that generated by a freely oscillating spring.

In an embodiment, the damping member is a shock absorber-type.

In an embodiment, the force due to the delivery of the component acts directly upon a first end of the retaining device that faces towards the delivery mechanism.

In an embodiment, the damping member includes a coupling member that acts to acts to couple the retaining device to the mounting head depending on the position of the retaining device relative to the mounting head. The coupling member is engaged or disengaged by a control unit that allows for the precise and controlled coupling of the restraining device to the mounting head. The coupling member acts to securely couple the retaining device to the mounting head as the mounting unit apparatus acts to receive the electrical component from the delivery mechanism. In turn, the coupling elements acts to decouple or disengage the retaining device from the mounting head so that the spring member can apply an optimal spring contract pressure to the component for mounting the component onto the substrate.

In an embodiment, the coupling member include vacuum coupling, magnetic coupling, friction coupling or mechanical coupling member.

DETAILED DESCRIPTION OF THE PREFERRED EMBODIMENTS

Figure 1:
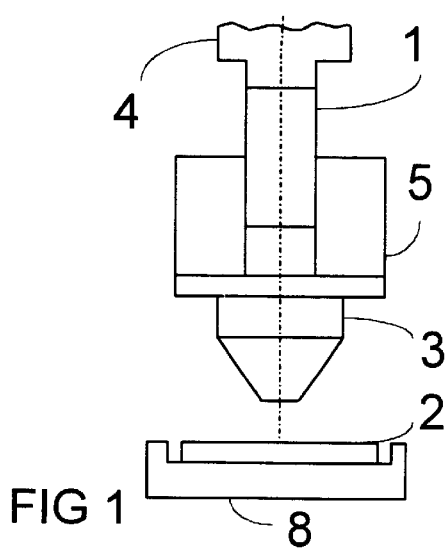
FIG. 1 is a side view of a retaining device that employs a compensating element prior to the component delivery stage.

In FIG. 1, an electrical component mounting device or apparatus includes a retaining device that is depicted as a suction pipette 1 for receiving an electrical component 2 from a delivery mechanism 8. The suction pipette 1 holds the component 2 via a suction force. However, the present invention is not limited by the use of a suction pipette that utilizes a suction force and applies to other like retaining devices that utilize other like forces, such as, frictional forces, for mounting the electrical component by receiving, transporting, and subsequently placing the electrical component onto a substrate of an electrical assembly.

The suction pipette 1 is coupled to a mounting head 4 of the component mounting apparatus which is not illustrated in detail. The suction pipette 1 includes a suction pipette first end 3 that is directed towards the electrical component 2. At least a portion of the suction pipette first end 3 is connected to the mounting head 4 via a compensating element 5. When the suction pipette 1 contacts the electrical component 2, the compensating element 5 of the suction pipette 1 acts to apply a contact pressure to the component 2 so that it is not damaged. The compensating element 5 has a spring type member that allows for the contact pressure to be adjusted depending on the varying thicknesses of a variety of different components.

Figure 2:
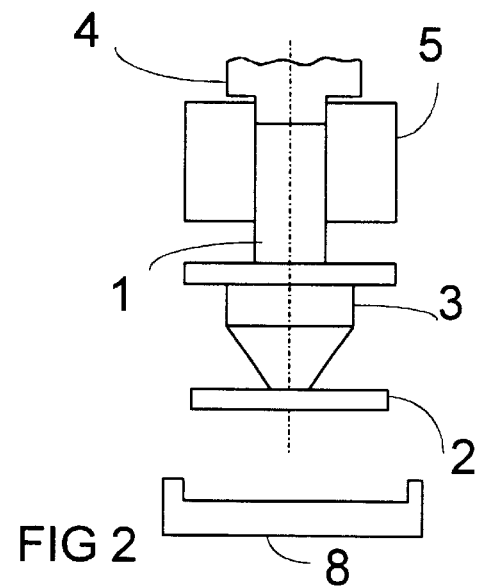
FIG. 2 is a side view of a retaining device of FIG. 1 during the component delivery stage.

During the component delivery stage where the electrical component 2 is delivered or supplied from the delivery mechanism 8 via the suction pipette 1, the suction pipette first end 3 is securely coupled to the mounting head 4 as illustrated in FIG. 2. As a result, the force due to the compensating element 5 is effectively reduced by a damping member to prevent the retaining device 1 from dropping the component 2. By effectively reducing the undesirable effects of the force due to the compensating element 5, the retaining device 1 will securely hold the component even under an increased speed at which the mounting head 4 drives the retaining device 1 during the component delivery. In this way, the component delivery rate can be effectively increased to facilitate an optimal component mounting process.

Figure 3:
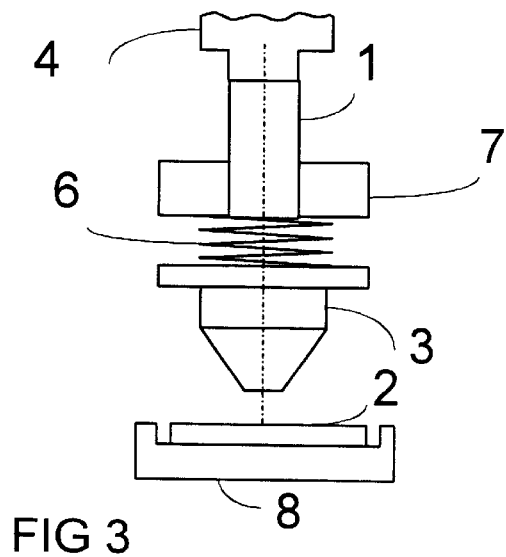
FIG. 3 is a side view of a retaining device that employs a spring and coupling members prior to the component delivery stage.
Figure 4:
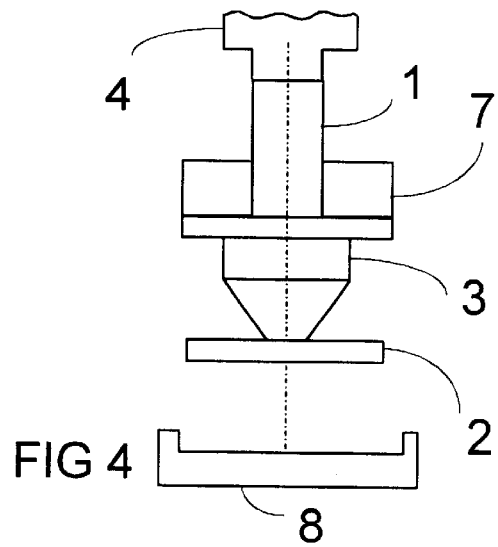
FIG. 4 is a side view of a retaining device of FIG. 3 during the component delivery stage.

An alternative embodiment is demonstrated in FIGS. 3 and 4 wherein the component mounting apparatus employs a compensating element that includes a spring 6 and coupling members 7. The suction pipette first end 3 is coupled to the mounting head 4 via a spring member 6. In addition, a coupling member 7 engages the suction pipette end 3 and acts to dampen the undesirable effects of the spring member 6 during the component delivery as previously discussed. The engageable coupling member 7 operates by vacuum coupling, friction coupling, magnetic coupling, mechanical coupling, or other like coupling principles. The mechanical coupling can be achieved by a piezo element or other like mechanical coupling element.

When the suction pipette 1 contacts the electrical component 2 that is positioned in the delivery mechanism 8, a definite and precise contact pressure is applied to the component 2 that corresponds to the tension that is exerted by the spring member 6. Upon delivering or lifting the electrical component 2 towards the mounting unit, the engageable coupling elements 7 are activated wherein the spring 6 remains in a compressed state as illustrated in FIG. 4. As a result, the force of the mounting head 4 acts directly onto the electrical component 2 as the component is moved away from the delivery mechanism 8. As the force of the mounting head 4 decreases, the damping effect of the coupling member 7 on the spring member 6 is then minimized.

After the component delivery stage, the electrical component is transferred to a desired or predetermined position on the substrate and then subsequently mounted onto the desired position again under the influence of the spring member 6 that utilizes an optimal contact pressure depending on the thickness of a variety of different substrates and components as previously discussed in order to ensure that the component is not damaged.

Figure 5:
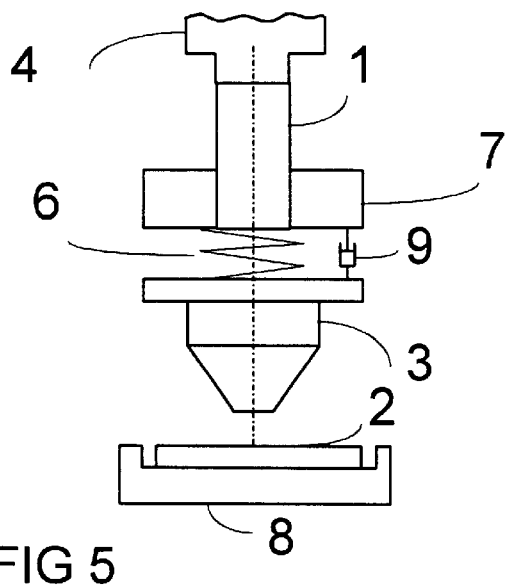
FIG. 5 is a side view of a retaining device that employs a shock absorber-type and spring members prior to the component delivery stage.
Figure 6:
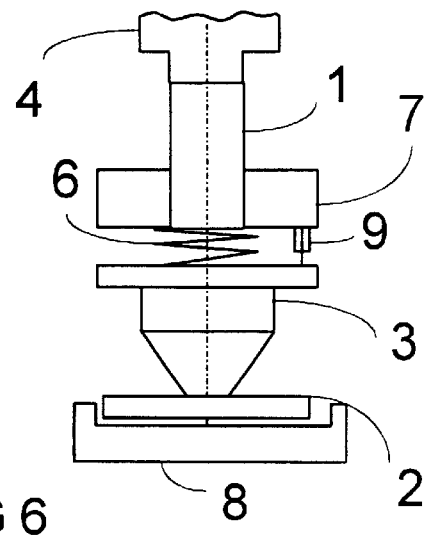
FIG. 6 is a side view of a retaining device of FIG. 5 during the component delivery stage.

In an embodiment as depicted in FIGS. 5 and 6, the component mounting apparatus includes a compensating element that has a spring and shock absorber-type member. The spring and shock absorber-type members of the compensating element act to facilitate an optimal component mounting operation as previously discussed.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method of mounting an electrical component onto a substrate of an electrical assembly comprising the steps of:
   providing a component mounting apparatus that includes a mounting head member, a retaining device attached to said mounting head member and a delivery mechanism for supplying an electrical component, said retaining device including a compensating element;
   securing said electrical component of said delivery mechanism to said retaining device by applying a contact pressure of said compensating element;
   lifting said electrical component from said delivery mechanism by moving said retaining device away from said delivery mechanism wherein a spring motion of said compensating element is damped;
   transferring said electrical component to a predetermined substrate position of said substrate; and
   depositing said electrical component onto said predetermined substrate position by applying said contact pressure of said compensating element.

2. A method according to claim 1 wherein said compensating element comprises a spring member and a coupling member.

3. A method according to claim 1 wherein said compensating element comprises a spring member and a shock absorber-type member.

4. An apparatus for mounting a component onto a substrate of an electrical assembly, comprising:
   a mounting head member and a retaining device attached to said mounting head member for mounting said component onto said substrate, said retaining device including a compensating element that has a damping member and a spring member, said spring member including a spring contact pressure and a spring force;
   a component delivery mechanism attached for delivering said component to said mounting head member during a component delivery stage;
   said retaining device securely attaching to said component during said component delivery stage by applying said spring contact pressure, said damping member damping said spring member when said component is moved away from said delivery mechanism so as to effectively reduce said spring force, and said retaining device transporting said component to a predetermined substrate position of said substrate for depositing said component onto said predetermined substrate position by applying said spring contact pressure.

5. An apparatus according to claim 4 wherein said damping member comprises a shock absorber-type member.

6. An apparatus according to claim 4 wherein said damping member comprises a coupling member.

7. An apparatus according to claim 6 wherein said coupling member comprises a vacuum coupling element.

8. An apparatus according to claim 6 wherein said coupling member comprises a friction coupling member.

9. An apparatus according to claim 6 wherein said coupling member comprises a magnetic coupling member.

10. An apparatus according to claim 6 wherein said coupling member comprises a mechanical coupling member.

11. An apparatus according to claim 10 wherein said mechanical coupling member comprises a mechanical coupling piezo element.

12. An apparatus according to claim 4 wherein said retaining device further comprises a first retaining end for mounting said component and wherein said damping element acts to effectively reduce said spring component delivery force that acts on said first retaining end when said component is removed from said delivery mechanism.

13. An apparatus according to claim 4 further comprising a damping control unit for controlling said damping member.

* * * * *